United States Patent [19]

Tracy et al.

[11] Patent Number: 5,364,703
[45] Date of Patent: Nov. 15, 1994

[54] COPPER-CLAD POLYETHERIMIDE LAMINATES WITH HIGH PEEL STRENGTH

[75] Inventors: James E. Tracy, Glenford, Ohio; John T. Bartholomew, Ballston Lake, N.Y.

[73] Assignee: General Electric Company, Coshocton, Ohio

[21] Appl. No.: 464,819

[22] Filed: Jan. 16, 1990

[51] Int. Cl.$^5$ .............................................. B32B 15/08
[52] U.S. Cl. .................................. 428/460; 156/307.3; 156/327; 156/335; 428/473.5; 525/61; 525/472; 525/491
[58] Field of Search ...................... 156/327, 335, 307.3; 524/81; 428/473.5, 460; 525/472, 491, 61

[56] References Cited

U.S. PATENT DOCUMENTS

| | | | |
|---|---|---|---|
| 3,450,595 | 6/1969 | Salter et al. | 156/335 |
| 4,626,474 | 12/1986 | Kim | 428/473.5 |
| 4,765,860 | 8/1988 | Ueno et al. | 156/307.3 |
| 4,906,515 | 3/1990 | Inoguchi | 428/473.5 |
| 4,927,742 | 5/1990 | Kohm | 156/661.1 |

Primary Examiner—John J. Gallagher

[57] ABSTRACT

The present invention is directed to improving the peel strength of copper foil laminated to polyetherimide substrates which optionally are reinforced. The improvement in process comprises coating one side of the copper foil with an adhesive composition, placing the coated side of the copper foil in contact with pre-formed polyetherimide substrate, and heat-pressing the resulting build-up to form a cured laminate of improved peel strength. The adhesive composition utilized comprises a blend of a polyvinyl butyral resin; one or more resole resins, and an organic solvent. Heat-pressing conditions comprise a temperature ranging from about 450° to 550° F. and pressing conditions ranging from about 100 to 700 psi. Within this temperature/pressure range, the adhesive-coated copper foil mated with the pre-formed polyetherimide substrate yields desired peel strengths without inducing excessive flow of the polyetherimide substrate, i.e. maintaining a pre-desired thickness ±7.5%.

14 Claims, No Drawings

COPPER-CLAD POLYETHERIMIDE LAMINATES WITH HIGH PEEL STRENGTH

BACKGROUND OF THE INVENTION

The present invention relates to the production of printed wiring boards (PWB) using polyetherimide substrates and more particularly to improving the peel strength of the copper foil bonded thereto.

A variety of substrates have been used in the production of copper-clad laminates for printed wiring boards, including woven fabrics, non-woven fabrics, paper-like materials made from glass fibers, organic fibers, wood pulp, and the like with various thermosetting resins including phenolic resins, epoxy resins, polyester resins, and the like. Specific structures include, for example, paper-phenolic resin, glass mat-polyester, glass cloth-epoxy resin, and like systems. The laminates generally have been produced by impregnating or coating a substrate with a varnish which is liquid at room temperature and has been diluted with a solvent, removing the solvent in a dryer, and simultaneously proceeding the reaction to a state suitable for press molding in a later stage. This produces a so-called pre-preg wherein the varnish has proceeded to the B stage. The pre-pregs can be cut to dimension, copper foil placed adjacent one or both surfaces of the pre-preg, and the multi-layer structure sent to pressure molding operations for ultimate cure of the pre-preg and its bonding to the copper foil.

A variety of alternative manufacturing procedures have been proposed in the art. For example, the so-called SMC process utilizes glass chopped strands which are impregnated with an unsaturated polyester resin which has its viscosity chemically increased for handling. A copper foil is affixed to the surface of the impregnated mat and the resulting structure supplied to a heated pressure mold. The pultrusion process for producing a laminate comprises passing a substrate through an unsaturated polyester resin bath for impregnation with the resin, supplying the substrate together with the copper foil into a heating die, and conducting continuous molding. British Pat. No. 1,525,872 proposes the use of a solventless resin bath for impregnation of the reinforcement and conducts molding by calendering or heating roller press operation. Japanese Kokai 13589/79 proposes the formation of a mixture of solventless resin and filler into a sheet-like material using an extruder followed by conducting a reaction to the B stage. Application of the copper foil and molding then proceeds, e.g. using a belting press. Finally, U.S. Pat. No. 4,510,008 proposes to coat a solventless thermosetting resin onto one surface of a fibrous substrate. Copper foil then is placed in contact with the coated side of the substrate and the laminate subjected to pressure molding.

In making copper-clad laminates utilizing polyetherimide substrates, optionally reinforced, U.S. Pat. No. 3,682,960 proposes a solvent solution of curable polyamic acid and an amide-modified polyamic acid which is coated on the metal foil and cured. This same type of coating approach for polyetherimides, polyamides, polyimides, and like substrates is proposed in U.S. Pat. Nos. 4,562,119, 4,374,972, and 4,433,131. Adequate peel strengths of the copper foil are reported in these citations. However, when a pre-formed polyetherimide extrudate is placed in contact with copper foil and the laminate sent to a heated press, copper foil peel strengths of the resulting cured laminate are insufficient for a variety of industrial applications.

BROAD STATEMENT OF THE INVENTION

The present invention is directed to improving the peel strength of copper foil laminated to polyetherimide substrates which optionally are reinforced. The improvement in process comprises coating one side of the copper foil with an adhesive composition, placing the coated side of the copper foil in contact with pre-formed polyetherimide substrate, and heat-pressing the resulting laminate to form a cured laminate of improved peel strength. The adhesive composition utilized comprises a blend of a polyvinyl butyral resin, one or more resole resins, and an organic solvent. Heat-pressing conditions comprise a temperature ranging from about 450° to 500° F. and pressing conditions ranging from about 100 to 700 psi, and preferably about 480°-530° F. and about 200 to 400 psi. Within this temperature/pressure range, the adhesively-coated copper foil mated with the pre-formed polyetherimide substrate yields desired peel strengths without inducing excessive flow of the polyetherimide substrate, i.e. maintaining a pre-desired thickness ±7.5%.

Advantages of the present invention include the ability to produce copper-clad polyetherimide substrates characterized by uniform and reliable peel strengths. Another advantage is the ability to maintain a flatness specification of the resulting copper-clad substrates. These and other advantages will be readily apparent to those skilled in the art based upon the disclosure contained herein.

DETAILED DESCRIPTION OF THE INVENTION

The distinguishing feature of the copper clad laminate of the present invention is the use of a specific adhesive-coated copper to ensure that the peel strength over the entire laminate will be above a minimum value, currently set at 6 lb/in-width. The peel strength achieved depends upon the temperature and pressure used during the pressing operation. The temperature cannot be too high, however, otherwise the polyetherimide thermoplastic material will flow too much, resulting in laminates out of specification with respect to thickness or having thin spots. In either case, an unacceptable laminate results. Accordingly, matching the adhesive to the temperature/pressure conditions used during laminate formation is important.

Referring to the adhesive initially, the adhesive composition is formulated generally from a blend of a polyvinyl butyral resin, one or more resole resins, and an organic solvent therefor. The polyvinyl butyral resin should have a molecular weight (weight average) ranging from about 180,000 to 270,000 for use in formulating the adhesive composition and is present on a solids basis ranging from between about 49 and 51% by weight.

Resole resins are well known in the art as is their preparation from a variety of ionizable catalytic agents, including various alkali metals, alkaline earth metals, and amines. One particular class of resole resins are benzylic ether resins, such as described in U.S. Pat. Nos. 3,409,579 and 3,676,392. Benzylic ether resins can be formed by a reaction of a phenol and an aldehyde under substantial anhydrous conditions at temperatures below about 130° C. in the presence of a catalytic concentration of a metal ion dissolved in the reaction medium. Benzylic ether resins also can be formed using catalysts, which the art has used in forming non-anhydrous resoles, by the aqueous reaction of a phenol and a formaldehyde at low temperature, subsequently neutralizing the reaction medium to a pH of about 3.8–5.3 to form insoluble, non-ionizable salts, and then stripping the reaction medium under vacuum at temperatures ranging up to 130° C. The insoluble, non-ionizable salts may be removed by filtration or other common means prior to the dehydration reaction in order to lower the residual ionizabilty even more. The preparation and characterization of some of these resins is disclosed in greater detail in U.S. Pat. No. 3,485,797. Such catalytic agents include sodium, zinc acetate, lead acetate, lithium naphthanate, lead naphthanate, lead oxide, and the like. The benzylic ether resins as formed in the references above also are known as high ortho-ortho resins in that the resin is characterized by ortho-ortho linkages, compared to conventional resole resins, whether anhydrously formed or not, wherein ortho-para linkages predominate.

Conventional ortho-para resole resins preferably are used for economy and are well-known in the art. The phenols employed in the formation of the phenolic resins generally include any phenol which has heretofore been employed in the formation of phenolic resins and which are not substituted either at the two ortho positions or at one ortho and the para position, such unsubstituted positions being necessary for the polymerization reaction to occur. Phenols substituted in these positions may be in lesser quantities (e.g. up to about 30%) to control molecular weight by a capping reaction. Any one, all, or none of the remaining carbon atoms of the phenol ring can be substituted in conventional fashion. The nature of these substituents can vary widely, and it is only necessary that the substituent not interfere in the polymerization of the aldehyde with the phenol at the ortho and/or para positions thereof (except for molecular weight control as noted above). Substituted phenols employed in the formation of phenolic resins include: alkyl substituted phenols, aryl substituted phenols, cyclo-alkyl substituted phenols, alkenyl substituted phenols, alkoxy substituted phenols, aryloxy substituted phenols, and halogen-substituted phenols, the foregoing substituents containing from 1 to 26, and preferably from 1 to 9, carbon atoms.

The aldehydes reacted with the phenol component can include any of the aldehydes heretofore employed in the formation of phenolic resins including, for example, formaldehyde, acetaldehyde, propionaldehyde, furfuraldehyde, and benzaldehyde. In general, the aldehydes employed have the formula R'CHO wherein R' is a hydrogen or hydrocarbon radical of 1–8 carbon atoms. While a variety of modifiers can be cooked into the resole resin in order to improve toughness, these modifiers are generally unnecessary and contribute to the cost of the adhesive formulation. The resole resin component on a solids basis generally ranges from about 49 to 51 wt-%. Preferably, a mixture of resole resins is used in forming the adhesive of the present invention (e.g., a phenol/cresylic acid/formalin resole catalyzed with ammonium hydroxide and a phenol/formalin phenol catalyzed with barium octahydrate).

The final component for the adhesive is a solvent. A variety of solvents can be used in cutting the phenol resin to a desired solids concentration and for formulating the adhesive of the present invention. These solvents include a variety of aromatic solvents, though these are usually not used for toxicity reasons. Preferable solvents include various Cellosolves, carbitols, ketones, and various alcohols. The proportion of solvent is adjusted so that the non-volatile solid content of the adhesive ranges from about 15 to 17%.

While a variety of polyetherimides are known in the art, the preferred polyetherimides for cladding in accordance with the present invention are prepared by reacting an organic diamine with an aromatic bis(ether dicarbonyl), i.e. an aromatic bis(ether anhydride) or an aromatic bis(ether dicarboxyic acid). Such polyetherimides are shown, for example, in U.S. Pat. Nos. 3,803,805, 3,787,364, 3,917,643, and 3,847,867.

In practicing the present invention, the adhesive formulation is drawn down and dried on one side of the copper foil. The adhesive coated copper foil is mated with the pre-formed polyetherimide substrate. This build-up is then is sent to a conventional press wherein temperatures and pressures as defined above are maintained for a time ranging from about 15 to 30 minutes. Presently, a minimum peel strength of 6 lb/in-width is desired with the thickness of the double-clad polyetherimide laminate ranging from about 0.063 to 0.073 inches. Median peel values observed for 2 oz cladded laminates generally range from about 11–13 lb/in-width while such values for 1 oz cladding generally range from about 9–10 lb/in-width.

EXAMPLES

EXAMPLE 1

An adhesive composition was formulated by initially synthesizing the following phenolic resins:

TABLE 1

| Ingredient | Resin (weight-parts) A | B |
|---|---|---|
| Synthetic Phenol | — | 2160 |
| 82% Phenol (12–14% ortho-Cresol) | 3010 | — |
| No. 8 Cresylic Acid | 490 | — |
| Methanol-Free Formalin (37.2% HCHO) | 3360 | 2332 |
| Methanol* | 3599 | 637 |
| Barium Octohydrate | — | 35 |
| Ammonium Hydroxide | 155 | — |
| Carbon Dioxide | | 16 |

*For Resin No. A, the reaction is run in 33 wt-parts methanol, 535 wt-parts are added after the reaction, and 266 wt-parts added post filtration. For Resin No. B, 102 wt-parts are used in the reaction and 535 wt-parts are added thereafter.

The final adhesive composition was formulated as follows:

TABLE 2

| Ingredient | Amount (wt-parts) |
|---|---|
| Resin No. A | 200 |
| Resin No. B | 600 |
| Polyvinyl Butyral Resin | 415 |
| Isopropyl Alcohol | 815 |
| Methyl Cellosolve | 570 |
| Methyl Ethyl Ketone | 2300 |

The final adhesive has a specific gravity range (25%) of 0.877–0.885, a resin content of 15.5–16.6 wt-%, and a viscosity at 25° C. (Hoeppler) of 558–875.

Copper foil (Gould JTC 2-oz/ft$^2$ electrolytically deposited foil) was coated on the treatment side with a uniform film of the final adhesive composition (approx. 5 mils wet film thickness). The solvent was removed by heating in a forced-air oven to produce an adhesive-coated copper foil with a dry adhesive film thickness of 0.35–0.55 mils.

EXAMPLE 2

Copper clad polyetherimide laminate panels (12"×28"- double clad -2 oz/ft² foil) were made by pressing Ultem polyetherimide 0.065 in. sheet (General Electric Co., Plastics Division, Pittsfield, Mass.) between sheets of the adhesive-coated copper foil (adhesive coated side toward the Ultem sheet) against polished stainless-steel press pans, with suitable cushioning material on the outsides of the press pans (glass-cloth reinforced silicone press, pads [Kleen Corp.]) in a hydraulic press with electrically heated plates at 530° F. and 300 psi for 20 minutes. Board thickness specification of 0.068±0.005 in. with cladding was maintained. Peel strength measurements then were taken at three locations for each layer of copper cladding. The following results were recorded.

TABLE 3

| | PEEL STRENGTH (lb/in-width) | | | | | |
|---|---|---|---|---|---|---|
| | Side 1 | | | Side 2 | | |
| Board No. | Left | Center | Right | Left | Center | Right |
| 89-044 | 7.2 | 6.6 | 11.4 | 6.2 | 6.2 | 10.6 |
| 89-049 | 13.8 | 14.0 | 14.6 | 12.6 | 12.8 | 13.0 |
| 89-050 | 11.6 | 13.4 | 13.6 | 12.6 | 13.6 | 13.2 |
| 89-052 | 13.4 | 14.0 | 9.2 | 11.2 | 14.4 | 13.8 |
| 89-053 | 12.6 | 11.2 | 9.4 | 10.0 | 10.6 | 7.6 |
| 89-054 | 12.6 | 12.2 | 13.6 | 11.6 | 10.8 | 11.6 |
| 89-056 | 12.8 | 13.0 | 10.4 | 10.8 | 12.6 | 9.6 |
| 89-058 | 9.2 | 10.4 | 10.8 | 8.6 | 9.4 | 9.2 |
| 89-059 | 12.2 | 11.8 | 12.0 | 11.6 | 11.4 | 11.4 |
| 89-060 | 12.8 | 11.0 | 10.6 | 7.8 | 10.8 | 8.4 |
| 89-061 | 12.0 | 10.4 | 12.8 | 10.8 | 12.0 | 11.6 |
| 89-062 | 12.8 | 13.6 | 12.8 | 11.4 | 12.0 | 11.6 |
| 89-063 | 11.6 | 11.8 | 12.8 | 11.0 | 11.2 | 11.8 |
| 89-064 | 11.0 | 11.0 | 9.4 | 9.4 | 10.0 | 8.8 |
| 89-065 | 11.4 | 11.6 | 12.4 | 9.8 | 9.4 | 11.0 |
| 89-066 | 10.8 | 11.8 | 11.0 | 10.2 | 11.4 | 9.8 |
| 89-067 | 13.2 | 13.4 | 14.2 | 11.6 | 13.0 | 13.0 |
| 89-068 | 11.0 | 10.2 | 11.4 | 9.8 | 9.6 | 8.0 |
| 89-069 | 9.4 | 9.6 | 10.2 | 7.8 | 8.8 | 8.4 |
| 89-070 | 11.0 | 9.6 | 10.0 | 10.0 | 9.4 | 7.4 |
| 89-072 | 12.8 | 13.2 | 13.6 | 11.6 | 11.8 | 11.6 |
| 89-073 | 13.0 | 13.6 | 13.6 | 10.8 | 11.4 | 11.6 |
| 89-074 | 13.0 | 13.0 | 13.6 | 10.8 | 11.4 | 10.0 |
| 89-075 | 11.2 | 11.8 | 12.0 | 11.0 | 11.4 | 10.0 |
| 89-076 | 11.4 | 13.6 | 10.2 | 9.6 | 10.2 | 9.4 |
| 89-077 | 12.5 | 13.2 | 10.2 | 12.6 | 12.6 | 10.4 |
| 89-078 | 12.6 | 11.8 | 10.0 | 10.0 | 10.4 | 7.4 |
| 89-082 | 12.0 | 12.2 | 12.6 | 10.4 | 11.4 | 10.0 |
| 89-083 | 11.8 | 13.2 | 13.4 | 11.2 | 12.0 | 12.2 |
| 89-086 | 13.2 | 14.2 | 13.4 | 12.2 | 13.4 | 11.6 |
| 89-087 | 13.0 | 12.8 | 13.6 | 11.4 | 12.4 | 11.8 |
| 89-089 | 12.0 | 11.0 | 12.2 | 11.4 | 12.2 | 12.4 |
| 89-091 | 14.2 | 12.0 | 13.0 | 13.0 | 11.8 | 12.2 |
| 89-093 | 14.0 | 14.6 | 12.6 | 10.6 | 12.2 | 12.8 |
| 89-094 | 14.4 | 13.4 | 14.8 | 11.6 | 11.6 | 12.4 |
| 89-095 | 12.0 | 9.0 | 12.4 | 11.6 | 7.0 | 11.2 |

The above tabulated data demonstrates the excellent and reproduceable peel strengths that the inventive adhesive provides.

What claim is:

1. A method for laminating metal foil having a surface to polyetherimide sheet having a surface which comprises coating said foil surface with an adhesive composition, contacting said adhesive coated foil surface with said sheet surface, and applying heat and pressure to adhesively bind said surfaces together, said adhesive composition comprising between about 49% and 51% by weight on a solids basis of a polyvinyl butyral resin, between about 49% and 51% by weight on a solids basis of a resole resin, and an organic solvent, said heat applied ranging from about 450° to 550° F. and said pressure applied ranging from about 100 to 700 psi.

2. The method of claim 1 wherein said adhesive composition comprises a mixture of resole resins.

3. The method of claim 1 wherein said resole resin is formulated from phenol and formaldehyde using a barium catalyst.

4. The method of claim 1 wherein said resole is formed from phenol, cresylic acid, and formaldehyde, using an ammonium hydroxide catalyst.

5. The method of claim 2 wherein said resole resins comprise a resole made from phenol and formaldehyde with a barium catalyst, and a resole made from phenol, cresylic acid, and formaldehyde using an ammonium hydroxide catalyst.

6. The method of claim 2 wherein said adhesive has a non-volatile solids content of between about 15 and 17 percent by weight.

7. The method of claim 1 wherein said heat applied ranges from about 480° F. to 530° F. and said pressure applied ranges from about 200 to 400 psi.

8. The method of claim 1 wherein said adhesive coated foil is applied to both sides of said polyetherimide sheet.

9. The method of claim 8 wherein the both sided foil laminated polyetherimide sheet ranges in thickness from between about 0.063 and 0.073 inches.

10. The method of claim 1 wherein the molecular weight (weight average) of said polyvinyl butyral resin ranges from about 180,000 to 270,000.

11. The method of claim 1 wherein the proportion of solvent is adjusted so that the adhesive composition has a non-volatile solids content of between about 15% and 17% by weight.

12. The foil laminated polyetherimide sheet prepared according to the process of claim 1.

13. The foil laminated polyetherimide sheet prepared according to the process of claim 10.

14. The foil laminated polyetherimide sheet of claim 12 wherein the peel strength of said sheet exceeds 6 lb/in-width.

* * * * *